United States Patent [19]
Vargha

[11] Patent Number: 6,069,516
[45] Date of Patent: May 30, 2000

[54] COMPACT VOLTAGE BIASING CIRCUITRY FOR ENHANCEMENT OF POWER MOSFET

[75] Inventor: Douglas A. Vargha, Palo Alto, Calif.

[73] Assignee: Maxim Integrated Products, Inc., Sunnyvale, Calif.

[21] Appl. No.: 09/067,784

[22] Filed: Apr. 28, 1998

[51] Int. Cl.$^7$ .................................................. H03K 17/16
[52] U.S. Cl. ........................................ 327/390; 327/589
[58] Field of Search .................................. 327/383, 389, 327/390, 391, 589, 536

[56] References Cited

U.S. PATENT DOCUMENTS

| | | | |
|---|---|---|---|
| 5,314,572 | 5/1994 | Core et al. | 156/643 |
| 5,345,824 | 9/1994 | Sherman et al. | 73/517 |
| 5,455,547 | 10/1995 | Lin et al. | 333/186 |
| 5,537,083 | 7/1996 | Lin et al. | 333/186 |
| 5,542,295 | 8/1996 | Howe et al. | 73/514.18 |
| 5,578,976 | 11/1996 | Yao | 333/262 |
| 5,583,753 | 12/1996 | Takayama | 363/71 |
| 5,589,082 | 12/1996 | Lin et al. | 216/2 |
| 5,594,380 | 1/1997 | Nam | 327/390 |
| 5,639,542 | 6/1997 | Howe et al. | 428/210 |
| 5,757,228 | 5/1998 | Furutani et al. | 327/390 |
| 5,767,729 | 6/1998 | Song | 327/390 |

OTHER PUBLICATIONS

J.M. Noworolski, S.R. Sanders, "*An Electrostatic Microresonant Power Conversion Device*", Dept. of Electrical Eng. And Computer Sciences, University of California at Berkeley, pp. 1–17.

Unknown, "*Maxim Quad, High–Side MOSFET Drivers*", 19–4325; Rev. 2, Oct. 1994, pp. 1–12, Maxim Integrated Products, Sunnyvale, CA.

*Primary Examiner*—Jung Ho Kim
*Attorney, Agent, or Firm*—Hickman Stephens Coleman & Hughes, LLP

[57] ABSTRACT

Disclosed is a biasing circuit for bringing a power FET to a substantial full enhancement. The biasing circuit includes: (a) a rail power voltage that is coupled to a drain terminal of the power field effect transistor; (b) a load being coupled between an other potential and a source terminal of the power field effect transistor; and (c) a micromachined DC/DC converter that is coupled between a gate terminal of the power field effect transistor and the rail power voltage. The micromachined DC/DC converter is configured to produce an enhanced voltage that is greater than the rail power voltage to the gate terminal of the power field effect transistor to achieve a substantial enhancement of the power field effect transistor.

24 Claims, 7 Drawing Sheets

COMPACT VOLTAGE BIASING CIRCUITRY FOR ENHANCEMENT OF POWER MOSFET

BACKGROUND OF THE INVENTION

1. Field of the Invention

The present invention relates generally to integrated circuits, and more particularly to cost effective and compact circuitry for enhancing power transistors.

2. Description of the Related Art

There are many computer and electronics applications in which power field effect transistors are being used. A common application is to use power field effect transistors to control the turn-on or turn-off of a load circuit. As is well known in the art of microelectronics, a load circuit (e.g., a circuit, a motor, an inductor, etc.) can be virtually any circuit that needs to be driven by some voltage source or current source. For example, in any given microelectronics application, circuit elements are driven by voltages that range between a rail voltage (Vcc) and a voltage (Vss), which may be a negative voltage or ground. However, enhancement mode, N-type power field effect transistors will generally require that the gate-to-source voltage be more positive that the rail voltage (Vcc) to achieve full enhancement. To accomplish this, designers typically use charge pump circuitry that, although simple in design, may be expensive and require a substantial amount of semiconductor die area to complete the circuit layout.

Figure 1:
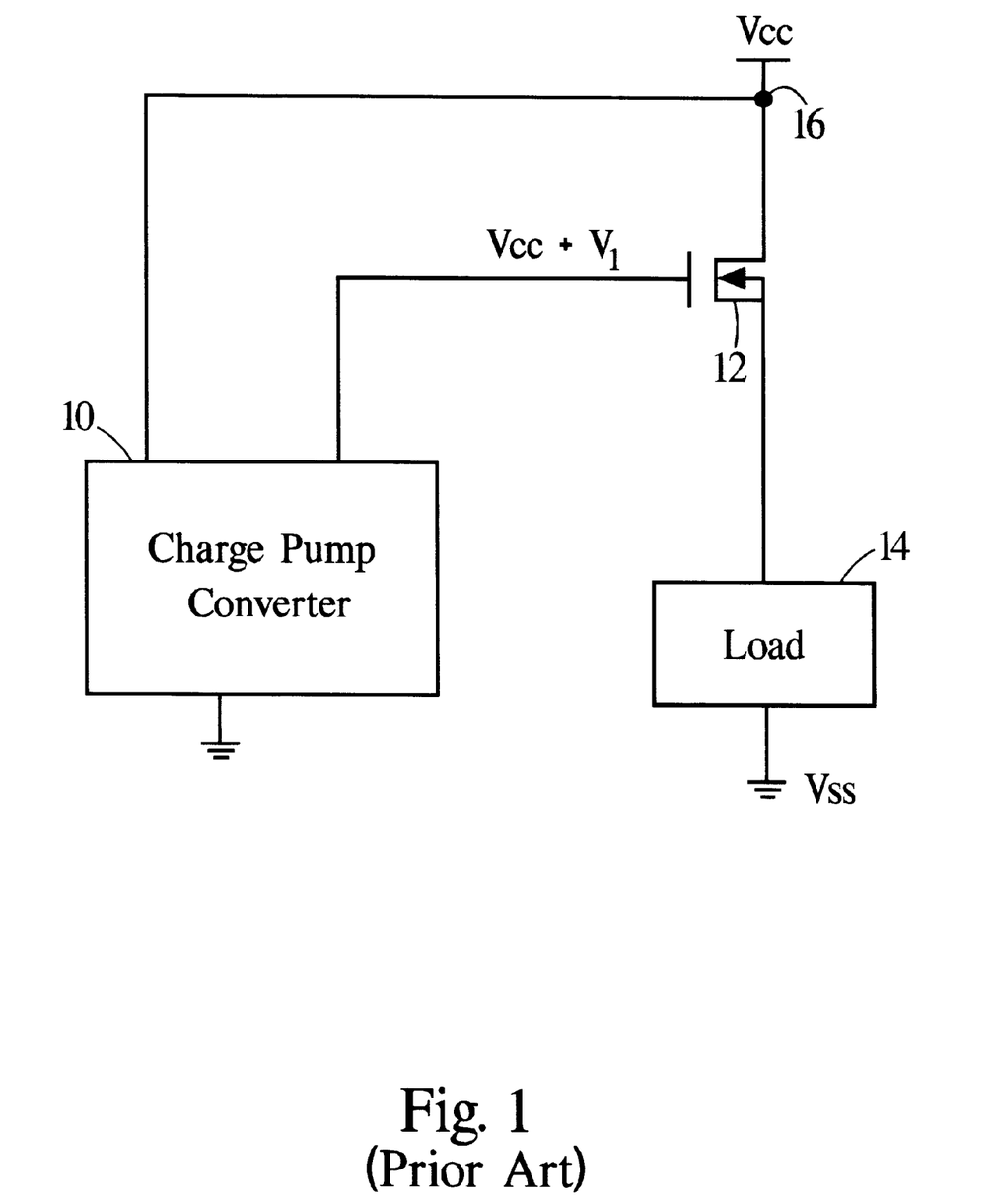
FIG. 1 shows a prior art charge pump converter that is used to provide an enhanced voltage to the gate of an N-type power field effect transistor to achieve full enhancement.

To elaborate further, FIG. 1 shows a prior art charge pump converter 10 that is used to provide an enhanced voltage (ie., Vcc+$V_1$) to the gate of an N-type power field effect transistor 12. Typically, the charge pump converter is required to produce a certain step-up ratio. Commonly, the charge pump converter circuitry implements boost stages to achieve the desired step-up ratio. Unfortunately, to produce greater step-up ratios, more boost stages will be required. That is, more boost stages and semiconductor die area is required to layout a quadrupler than is required to layout a doubler. As an example, to generate a bias gate voltage that is +8V larger than a +3V rail voltage supply, a quadrupler circuit would be required (i.e., 4*3V=12V). However, to generate a bias gate voltage that is +8V greater than a +12V rail voltage supply, only a doubler circuit would be required (i.e., 2*12=24).

In some applications, designers use specialized integrated circuit (IC) chips whose, sole purpose is to generate an increased voltage to ensure that a power field effect transistor becomes fully enhanced when required. For example, Maxim Integrated Products of Sunnyvale, California, stocks an individually packaged IC chip that outputs a regulated output voltage that is +11V greater that the rail voltage supply (Vcc). This IC chip is the "MAX620/MAX621" Quad, High-Side MOSFET Driver. The technical details of this IC chip, which can be obtained from Maxim Integrated Products, is hereby incorporated by reference. Typical applications for this chip include, portable computer battery load management, high-side power N-channel MOSFET switching, low-side switching from low supply voltages, quad-latching level transistors, and stepper motor drivers. Although the uses of such an IC chip are many, this IC chip must be routed to other applications over a PC board, and if it is integrated onto a chip along with other circuitry, the circuitry needed to route and complete the charge pump circuit components can be quite substantial and expensive.

In view of the foregoing, there is a need for simple and compact circuitry that may be used to generate a gate bias voltage that is greater than a standard rail voltage, without the need for large and possibly expensive space consuming charge pump circuitry.

SUMMARY OF THE INVENTION

Broadly speaking, the present invention fills these needs by providing a biasing circuit that implements a micromachined DC/DC converter to achieve full enhancement of a power field effect transistor. It should be appreciated that the present invention can be implemented in numerous ways, including as a method, a process, a system, an apparatus, or a device. Several inventive embodiments of the present invention are described below.

In one embodiment, a biasing circuit for turning on a power field effect transistor is disclosed. The biasing circuit includes: (a) a rail power voltage that is coupled to a drain terminal of the power field effect transistor; (b) a load being coupled between an other potential and a source terminal of the power field effect transistor; and (c) a micromachined DC/DC converter that is coupled between a gate terminal of the power field effect transistor and the rail power voltage. The micromachined DC/DC converter is configured to produce an enhanced voltage that is greater than the rail power voltage to the gate terminal of the power field effect transistor to achieve a substantial enhancement of the power field effect transistor.

In another embodiment, another biasing circuit for turning on a power field effect transistor is disclosed. The biasing circuit includes: (a) a rail power voltage that is coupled to a drain terminal of the power field effect transistor; (b) a load that is coupled between an other potential and a source terminal of the power field effect transistor; and (c) a micromachined DC/DC converter that is coupled between a gate terminal of the power field effect transistor and a turn-on rail power voltage that is about equal to the rail power voltage. The micromachined DC/DC converter is configured to produced an enhanced voltage that is greater than the turn-on rail power voltage and the rail power voltage, such that the enhanced voltage is communicated to the gate terminal of the power field effect transistor to achieve a substantial enhancement of the power field effect transistor.

In yet another embodiment, another biasing circuit for turning on a power field effect transistor is disclosed. The biasing circuit includes: (a) a rail power voltage that is coupled to a first terminal of the power field effect transistor; (b) a load that is coupled between an other potential and a second terminal of the power field effect transistor; and (c) a micromachined DC/DC converter that is coupled between a gate terminal of the power field effect transistor and the rail power voltage. The micromachined DC/DC converter is configured to produced an enhanced voltage that is greater than the rail power voltage to the gate terminal of the power field effect transistor to achieve a substantial enhancement of the power field effect transistor. Preferably, the biasing circuit also includes a switch that is coupled in communication between the micromachined DC/DC converter and the gate terminal of the power field effect transistor to control an application of the enhanced voltage to the gate terminal.

Advantageously, the embodiments of the present invention enable the design of biasing circuitry that may be more compact or less expensive than prior art charge pump biasing circuitry. That is, the use of a micromachined DC/DC converter provides the flexibility of designing the biasing circuitry on the same chip as the load circuitry, which therefore takes up less costly silicon chip area. Further yet, the micromachined DC/DC converter can be fabricated using standard semiconductor processing or modified semiconductor processing, which further decreases the need for custom off-chip circuitry to control biasing of power MOSFETs. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

Biasing circuits that implement a micromachined DC/DC converter to achieve substantial full enhancement of power field effect transistors are disclosed. In the following description, numerous specific details are set forth in order to provide a thorough understanding of the present invention. It will be understood, however, to one skilled in the art, that the present invention may be practiced without limitation to some or all of these specific details. In other instances, well known process operations have not been described in detail in order not to unnecessarily obscure the present invention.

Figure 2A:
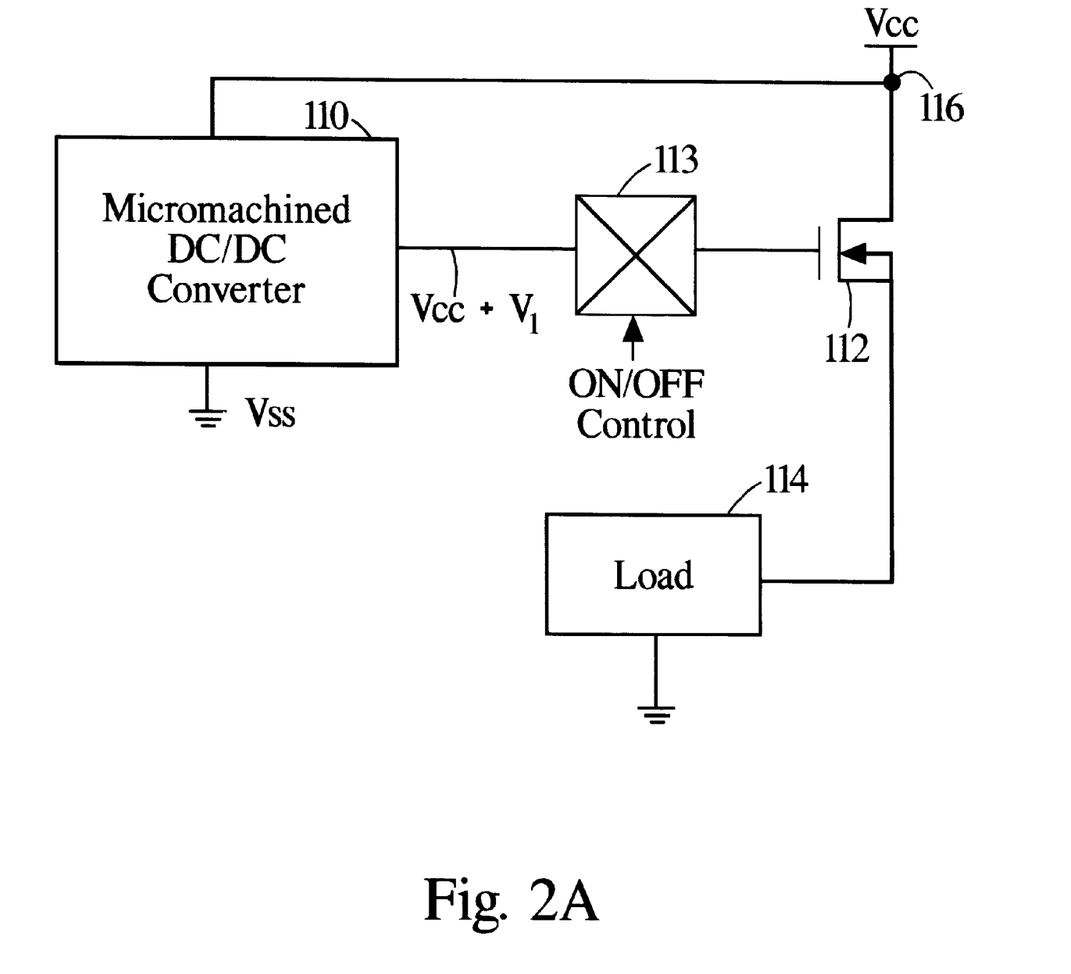
FIGS. 2A–2B show N-channel MOSFET devices that have their gates connected to an output of a micromachined DC/DC converter in accordance with one embodiment of the present invention.

FIG. 2A shows an N-channel MOSFET device 112 that has its gate connected to a micromachined DC/DC converter in accordance with one embodiment of the present invention. As shown, the N-channel MOSFET 112 has its drain connected to a node 116, which is in turn coupled to a rail voltage Vcc and the micromachined DC/DC converter. The source of the N-channel MOSFET 112 is thus connected to a load 114. As is well known in the art, the load 114 can be virtually any circuit device that needs to be driven by a supply voltage (or current source), such as the rail voltage Vcc. However, to enable electrical conduction from the rail voltage Vcc to the load 114, the N-channel MOSFET 112 must be turned ON, and therefore, caused to be in substantial enhancement.

In this embodiment, the output of the micromachined DC/DC converter 110 is configured to continually produce an enhanced voltage that is greater than the rail voltage Vcc (i.e., Vcc+V1). This enhanced voltage is thus passed to a switch 113, which is configured to be turned ON or OFF in response to an ON/OFF Control signal. In this manner, the enhanced voltage is only provided to the N-channel MOSFET 112 when it is to be enhanced.

Figure 2B:
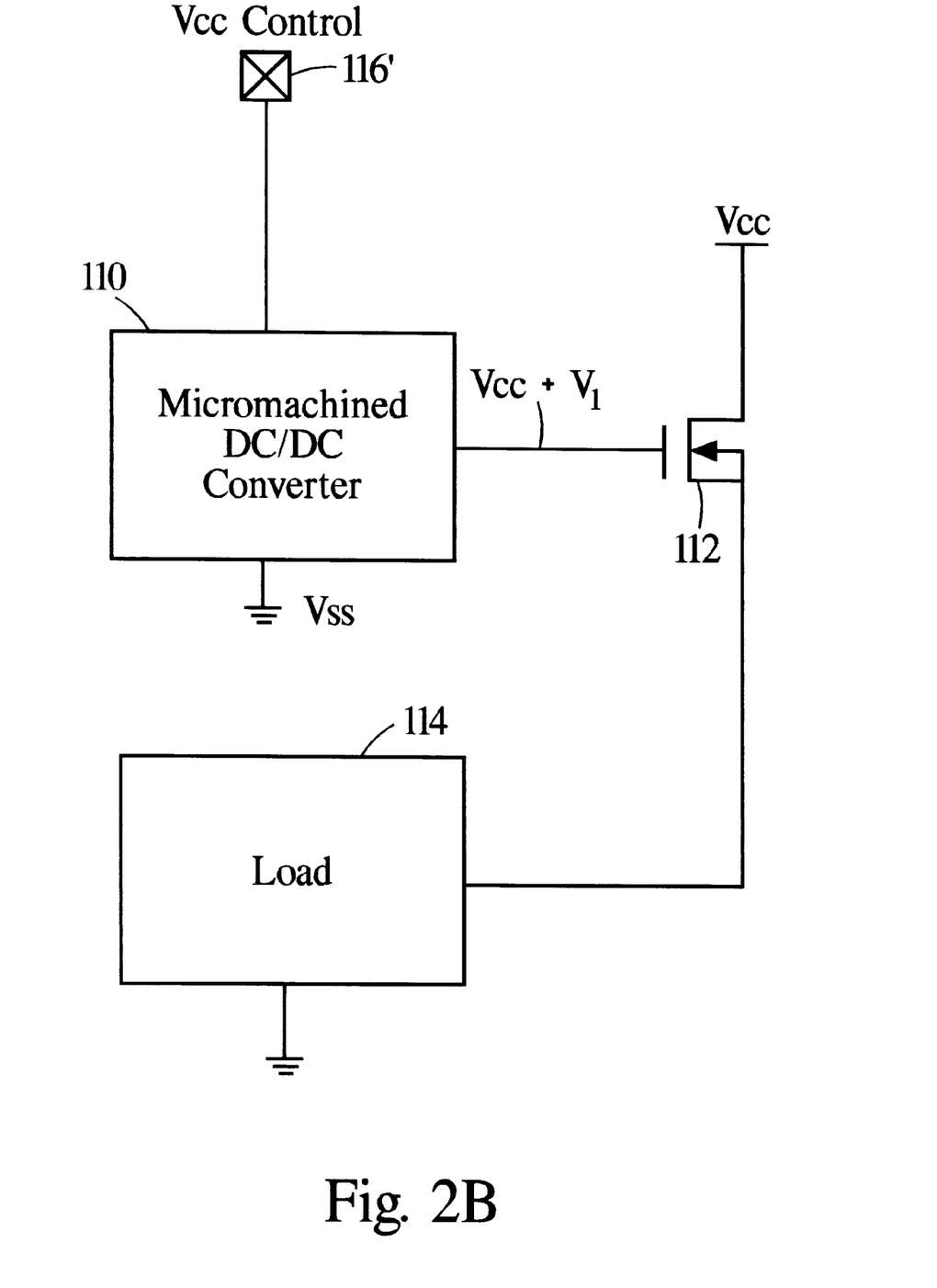

FIG. 2B illustrates an alternative embodiment in which the N-channel MOSFET 112 is enhanced when a Vcc Control voltage 116' (i.e., a turn-on voltage) is applied to the micromachined DC/DC converter 110. As is well known in the art, the Vcc Control voltage 116' can be supplied internally on the same chip, or from another chip or circuit module. In either way, the Vcc Control voltage 116' removes the need for the integration of the switch 113 of FIG. 2A.

Preferably, the micromachined DC/DC converter 110 is a micro electro mechanical system (MEMS), which may be integrated onto a semiconductor chip on substantially less semiconductor die area than is needed for charge pump converter implementations, or with a substantial savings in manufacturing costs.

Figure 2C:
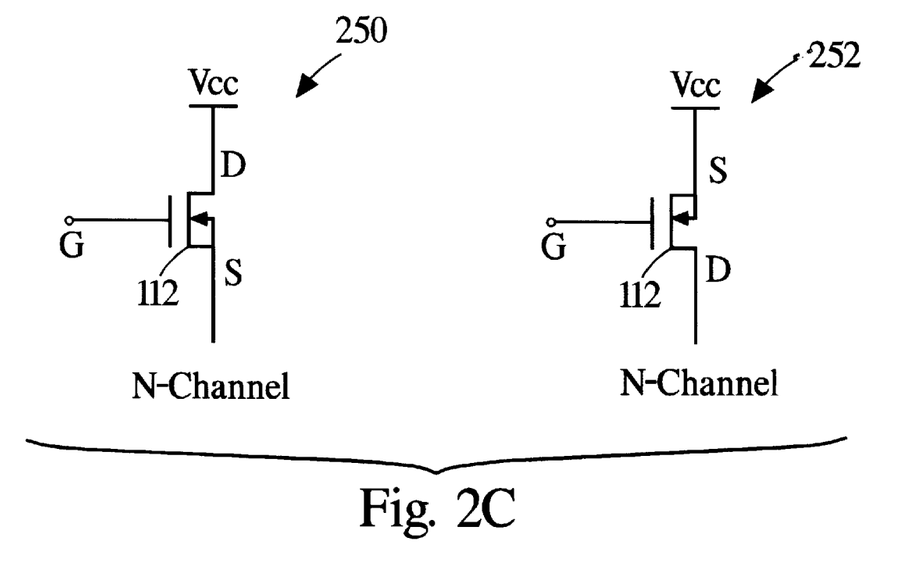
FIGS. 2C–2D illustrate exemplary interconnection orientations for N-channel MOSFETs and P-channel MOSFETs in accordance with one embodiment of the present invention.

As can be appreciated, by connecting the output of the micromachined DC/DC converter 110 to a gate of an N-channel MOSFET, the gate will be biased with a voltage that is greater than the voltage that is present at the drain terminal. FIG. 2C shows a pictorial illustration of two N-channel MOSFET transistors 112. Although the most typical way of implementing an N-channel MOSFET is as shown in 250, where the drain "D" is connected to Vcc, the N-channel MOSFET may in some implementations be connected in reverse as shown in 252.

Figure 2D:
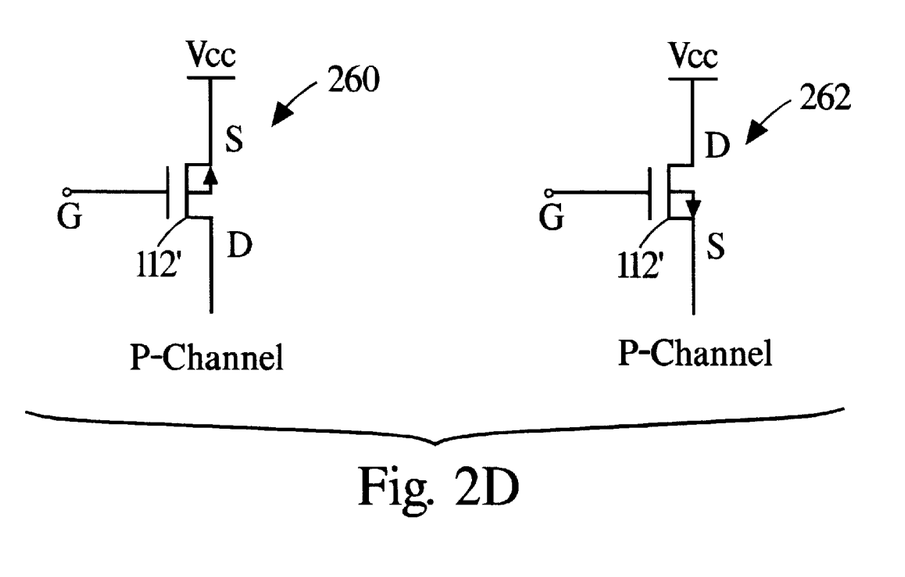

In a similar fashion, FIG. 2D illustrates a more typical P-channel MOSFET 112' orientation 260, where the source "S" is connected to Vcc, and an alternative orientation 262. Accordingly, it should be understood that substantial benefits are generated out of connecting an output of a micromachined DC/DC converter to the gate terminal of a MOSFET, no matter what the interconnection orientation is or whether the MOSFET is an N-channel or P-channel device.

Figure 3A:
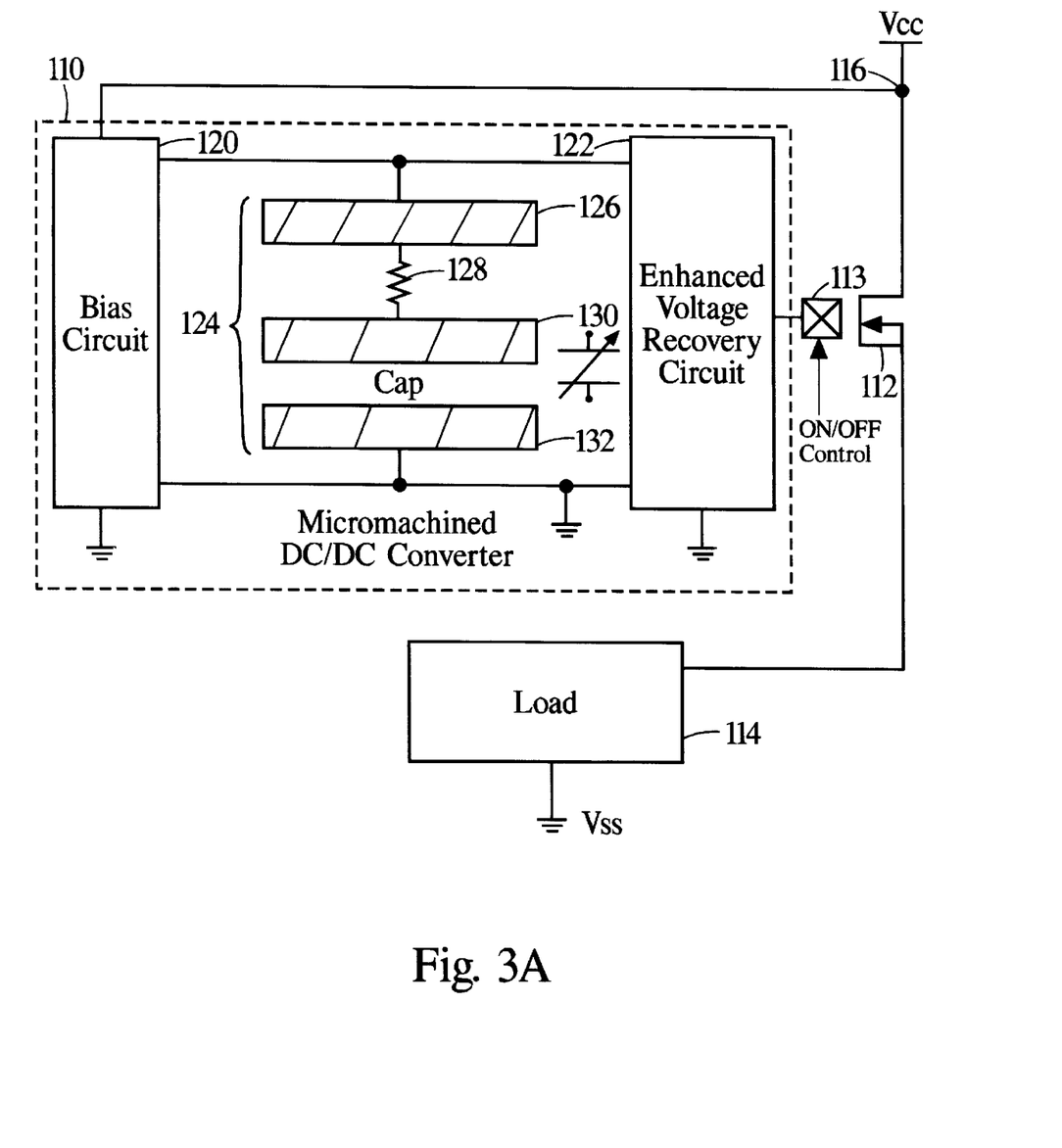
FIGS. 3A–3B are more detailed diagrams of exemplary internal components of the micromachined DC/DC converter, that implement a variable capacitor structure in accordance with one embodiment of the present invention.

FIG. 3A shows a more detailed diagram of the internal features of he micromachined DC/DC converter 110, that implements a variable capacitor 124. The variable capacitor includes a stationary upper plate 126, a stationary lower plate 132, and a movable plate 130. The movable plate 130 is coupled to the stationary upper plate 126 by a spring 128, which allows the movable plate 130 to move between the stationary upper plate 126 and the stationary lower plate 132. When the movable plate 130 translates, the gap between the stationary lower plate 132 and the movable plate 130 changes, which therefore causes a change in capacitance between the gap.

In operation, the movable plate 130 is caused to oscillate by applying the rail voltage Vcc through a bias circuit 120. Once the movable plate 130 is brought to a stable resonating frequency, the micromachined DC/DC converter 110 will be ready to generate an enhanced voltage.

Because the movable plate 130 will already be in a resonant state, an additional voltage "push" will cause an enhanced voltage swing (i.e., that is greater than Vcc) to be transferred to an enhanced voltage recovery circuit. The enhanced voltage recovery circuit is thus connected to the switch 113 that is configured to receive an ON/OFF control signal. When the switch 113 is ON (i.e., in an open state), the gate of the N-channel MOSFET 112 will be provided with a bias voltage that is greater than Vcc. By way of example, if Vcc is +3V, the gate voltage will be greater than Vcc (i.e., >+3V), which will allow the N-channel MOSFET to be substantially fully enhanced. In this manner, the gate-to-source voltage will be positive. For more information on the operation of micromachined DC/DC converters, reference may be made to an article entitled "An Electrostatic Microresonant Power Conversion Device," by J. Mark Noworolski and Seth R. Sanders, Power Electronics Specialists Conference (PESC), 1992. This article is hereby incorporated by reference in its enitirety.

Figure 3B:
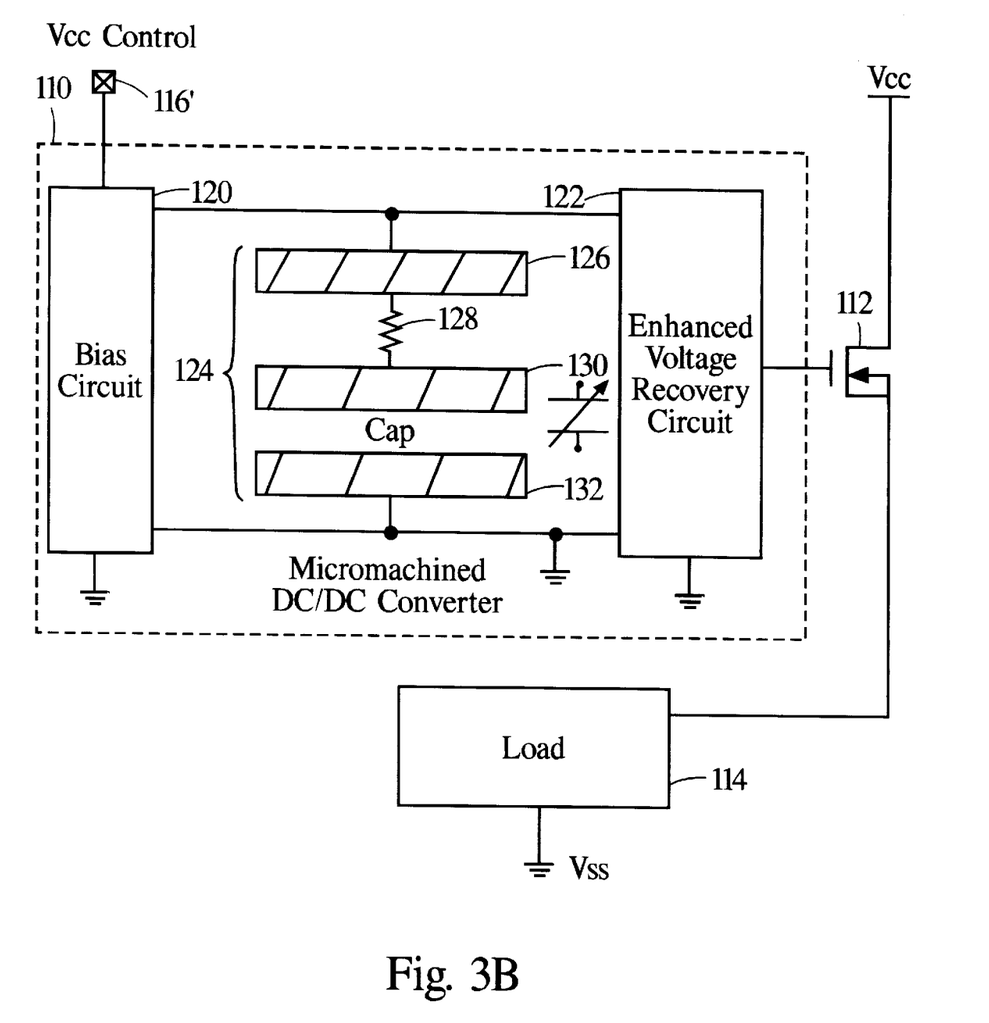

FIG. 3B shows a more detailed diagram of the internal features of the micromachined DC/DC converter 110 that implements the Vcc Control voltage 116' to control when an enhanced voltage is supplied to a MOSFET gate. As described above with reference to FIG. 2B, the Vcc Control voltage 116' removes the need for the separate integration of the switch 113.

Figure 4A:
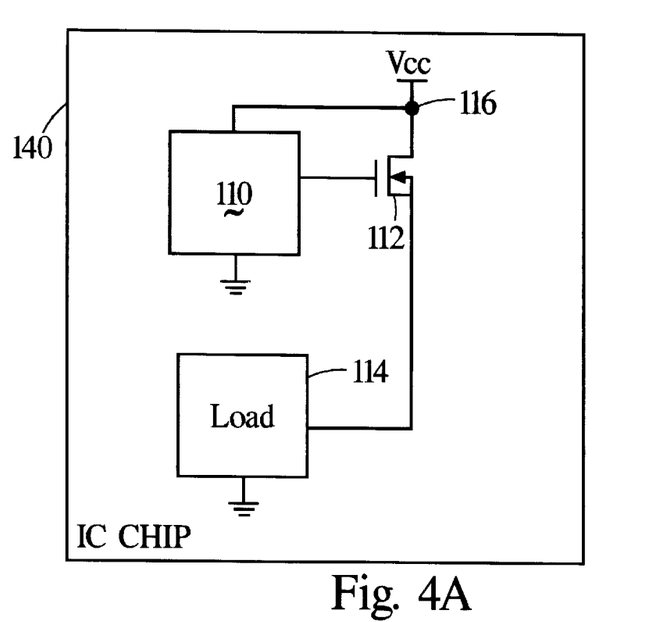
FIG. 4A is a top level block diagram of an integrated circuit (IC) chip having an integrated micromachined DC/DC converter in accordance with one embodiment of the present invention.

FIG. 4A is a top level block diagram of an integrated circuit (IC) chip 140 having an integrated micromachined DC/DC converter 110 in accordance with one embodiment of the present invention. Because the physical size of the micromachined DC/DC converter 110 may be substantially smaller than that of a charge pump converter, the physical micromachined structure may be fabricated along with other multi-level semiconductor device layers. For example, variable capacitor 124 can be constructed from patterned metallization lines, wherein one of the lines is partially suspended and allowed to resonate upon the application of a biasing voltage.

As is well known, the actual manufactured DC/DC converter structure can take many forms, so long as it is capable of producing the enhanced voltage, which in the embodiments of this invention is provided to a gate of a MOSFET. Although there are many types of micromachined oscillating structures, reference may be made to several exemplary U.S. Patents that describe oscillating structures. These exemplary patents are provided as follows: (1) U.S. Pat. No. 5,455,547, and entitled "Microelectromechanical signal processors", (2) U.S. Pat. No. 5,537,083, and entitled "Microelectromechanical signal processors", (3) U.S. Pat. No. 5,542,295, and entitled "Apparatus to Minimize Stiction in Micromachined Structures"; (4) U.S. Pat. No. 5,314,572, and entitled "Method for Fabricating Microstructures"; and (5) U.S. Pat. No. 5,578,976, and entitled "Micro Electromechanical RF Switch." All five U.S. Patents are hereby incorporated by reference herein.

Figure 4B:
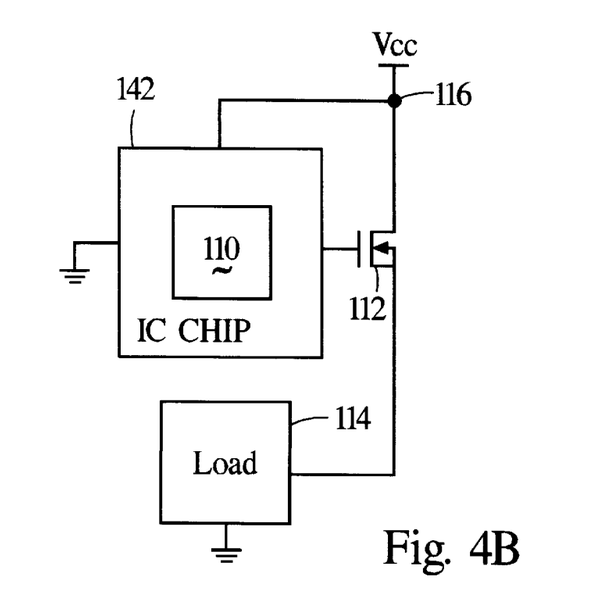
FIG. 4B illustrates another example in which the micromachined DC/DC converter is fabricated onto a single dedicated IC chip in accordance with one embodiment of the present invention.

FIG. 4B illustrates another example in which the micromachined DC/DC converter 110 is fabricated onto a single dedicated IC chip 142 in accordance with one embodiment of the present invention. As shown, the output of the micromachined DC/DC converter 10 is configured to output an enhanced voltage that is greater than Vcc to bias the N-channel MOSFET 112. As mentioned above, the enhanced voltage is well suited to substantially enhance the N-channel MOSFET 112 when the load 114 needs to be driven.

In an alternative embodiment, the micromachined DC/DC converter 110 can be set to generate an enhanced voltage that is more negative than a negative power supply. For example, in circuits where the power field effect transistor is a P-channel MOSFET, the gate must be biased with a voltage that is more negative than the rail voltage. In this embodiment, the micromachined DC/DC converter 110 can be biased with a negative or positive voltage potential and is caused to oscillate near a resonant frequency, to generate a voltage that is more negative than rail voltage.

Although the foregoing invention has been described in some detail for purposes of clarity of understanding, it will be apparent that certain changes and modifications may be practiced within the scope of the appended claims. In addition, it should be understood that the various circuit diagrams may be embodied in any form which may include, for example, any suitable substrate, printed circuit board, packaged integrated circuit, or software implementation. Accordingly, the present embodiments are to be considered as illustrative and not restrictive, and the invention is not to be limited to the details given herein, but may be modified within the scope and equivalents of the appended claims.

What is claimed is:

1. A biasing circuit for turning on a power field effect transistor, comprising:

a rail power voltage being coupled to a drain terminal of the power field effect transistor:

a load being coupled to a source terminal of the power field effect transistor:

a micromachined DC/DC converter being coupled between a gate terminal of the power field effect transistor and the rail power voltage, the micromachined DC/DC converter being configured to produce an enhanced voltage that is greater than the rail power voltage to the gate terminal of the power field effect transistor to achieve a substantial enhancement of the power field effect transistor, wherein the micromachined DC/DC converter includes a variable capacitor having a lower electrode and an upper electrode that is configured to oscillate near a resonant frequency.

2. A biasing circuit for turning on a power field effect transistor as recited in claim 1, wherein the variable capacitor is a semiconductor micromachined device.

3. A biasing circuit for turning on a power field effect transistor as recited in claim 2, further comprising:

a bias circuit that is coupled between the lower electrode and the upper electrode of the variable capacitor, and is used to control an applied voltage of the variable capacitor.

4. A biasing circuit for turning on a power field effect transistor as recited in claim 2, further comprising:

an enhanced voltage recovery circuit that is coupled between the lower electrode and the upper electrode of the variable capacitor, and is used to communicate the enhanced voltage that is transferred to the gate terminal of the power field effect transistor.

5. A biasing circuit for turning on a power field effect transistor as recited in claim 2, further comprising:

a switch that is in communication between the micromachined DC/DC converter and the gate terminal of the power field effect transistor.

6. A biasing circuit for turning on a power field effect transistor as recited in claim 2, wherein the load is selected from the group consisting of a circuit, a motor, an inductor, and a portable computer.

7. A biasing circuit for tuning, on a power field effect transistor as recited in claim 2, wherein the micromachined DC/DC converter is integrated onto a single integrated circuit chip.

8. A biasing circuit for turning on a power field effect transistor as recited in claim 2, wherein the micromachined DC/DC converter is integrated onto a integrated circuit chip having at least the power field effect transistor and a load.

9. A biasing circuit for turning on a power field effect transistor as recited in claim 2, wherein the rail power voltage is one of a positive voltage and a negative voltage.

10. A biasing circuit for turning on a power field effect transistor as recited in claim 9, wherein the enhanced voltage is either more positive than the rail power voltage or more negative than the rail power voltage.

11. A biasing circuit for turning on a power field effect transistor as recited in claim 2, wherein the power field effect transistor is one of an N-channel MOSFET and a P-channel MOSFET.

12. A biasing circuit for tuning on a power field effect transistor, comprising:
   a rail power voltage being coupled to a drain terminal of the power field effect transistor:
   a load being coupled to a source terminal of the power field effect transistor;
   a micromachined DC/DC converter being coupled between a gate terminal of the power field effect transistor and a turn-on rail power voltage that is about equal to the rail power voltage, the micromachined DC/DC converter being configured to produce an enhanced voltage that is greater than the turn-on rail power voltage and the rail power voltage, such that the enhanced voltage is communicated to the gate terminal of the power field effect transistor to achieve a substantial enhancement of the power field effect transistor, wherein the micromachined DC/DC converter includes a variable capacitor having a lower electrode and an upper electrode that is configured to oscillate near a resonant frequency.

13. A biasing circuit for turning on a power field effect transistor as recited in claim 12, wherein the variable capacitor is a semiconductor micromachined device.

14. A biasing circuit for turning on a power field effect transistor as recited in claim 12, further comprising:
   a bias circuit that is coupled between the lower electrode and the upper electrode of the variable capacitor, and is used to control an applied voltage of the variable capacitor.

15. A biasing circuit for turning on a power field effect transistor as recited in claim 14, further comprising:
   an enhanced voltage recovery circuit that is coupled between the lower electrode and the upper electrode of the variable capacitor, and is used to communicate the enhanced voltage that is transferred to the gate terminal of the power field effect transistor.

16. A biasing circuit for turning on a power field effect transistor as recited in claim 12, wherein the rail power voltage is one of a positive voltage and a negative voltage.

17. A biasing circuit for turning on a power field effect transistor as recited in claim 12, wherein the enhanced voltage is either more positive than the rail power voltage or more negative than the rail power voltage.

18. A biasing circuit for turning on a power field effect transistor as recited in claim 12, wherein the power field effect transistor is one of an N-channel MOSFET and a P-channel MOSFET.

19. A biasing circuit for turning on a power field effect transistor, comprising:
   a supply source being coupled to a first terminal of the power field effect transistor;
   a load being coupled between an other potential and a second terminal of the power field effect transistor;
   a micromachined DC/DC converter being coupled between a gate terminal of the power field effect transistor and the supply source, the micromachined DC/DC converter being configured to produce an enhanced voltage that is greater than the supply source to the gate terminal of the power field effect transistor to achieve a substantial enhancement of the power field effect transistor, wherein the micromachined DC/DC converter includes a variable capacitor having a lower electrode and an upper electrode that is configured to oscillate near a resonant frequency.

20. A biasing circuit for turning on a power field effect transistor as recited in claim 19, further comprising:
   a switch being coupled in communication between the micromachined DC/DC converter and the gate terminal of the power field effect transistor to control an application of the enhanced voltage to the gate terminal.

21. A biasing circuit for turning on a power field effect transistor as recited in claim 19, wherein the supply source is one of a positive voltage, a negative voltage, and a current source.

22. A biasing circuit for turning on a power field effect transistor as recited in claim 21, wherein the enhanced voltage is either more positive than the supply source or more negative than the supply source.

23. A biasing circuit for turning on a power field effect transistor as recited in claim 19, wherein the power field effect transistor is one of an N-channel MOSFET and a P-channel MOSFET.

24. A biasing circuit for turning on a power field effect transistor, comprising:
   a rail power voltage being coupled to a first terminal of the power field effect transistor;
   a load being coupled to a second terminal of the power field effect transistor;
   a micromachined DC/DC converter being coupled between a gate terminal of the power field effect transistor and a turn-on rail power voltage that is about equal to the rail power voltage, the micromachined DC/DC converter being configured to produce an enhanced voltage that is greater than the turn-on rail power voltage and the rail power voltage, such that the enhanced voltage is communicated to the gate terminal of the power field effect transistor to achieve a substantial enhancement of the power field effect transistor, wherein the micromachined DC/DC converter includes a variable capacitor having a lower electrode and an upper electrode that is configured to oscillate near a resonant frequency.

* * * * *

UNITED STATES PATENT AND TRADEMARK OFFICE
CERTIFICATE OF CORRECTION

PATENT NO.    : 6,069,516
DATED         : May 30, 2000
INVENTOR(S)   : Douglas A. Vargha It is certified that error appears in the above-identified patent and that said Letters Patent is hereby corrected as shown below:

Column 4,
Line 41, reads, "features of he micromachined DC/DC converter 110, that" It should read: -- features of the micromachined DC/DC converter 110, that --;

Column 5,
Line 9 reads: "incorporated by reference in its enitirety." It should read
-- incorporated by reference in its entirety. --;
Line 21, reads: "micromachined DC/DC' converter 110 may be substantially"
It should read: -- micromachined DC/DC converter 110 may be substantially --;
Line 49, reads: "micromachined DC/DC converter 10 is configured to output"
It should read -- micromachined DC/DC converter 110 is configured to output --;

Column 6,
Line 15, reads: "the power field effect transistor:" It should read:
-- the power field effect transistor; --;
Line 17, reads: "field effect transistor:" It should read:
-- field effect transistor; --;
Line 47, reads: "transistor as recited in claim 2, further comprising" It should read:
-- transistor as recited in claim 1, further comprising --;
Line 55, reads: "7. A biasing circuit for tuning, on a power field effect" It should read:
-- 7. A biasing circuit for turning on a power field effect --;
Line 60, reads: "transistor as recited in claim 2, wherein the micromachined" It should read -- transistor as recited in claim 1, wherein the micromachined --;

UNITED STATES PATENT AND TRADEMARK OFFICE
CERTIFICATE OF CORRECTION

PATENT NO. : 6,069,516
DATED : May 30, 2000
INVENTOR(S) : Douglas A. Vargha

It is certified that error appears in the above-identified patent and that said Letters Patent is hereby corrected as shown below:

Column 7,
Line 4, reads: "transistor as recited in claim 2, wherein the power field effect" It should read: -- transistor as recited in claim 1, wherein the power field effect --;
Line 7, reads: "12. A biasing circuit for tuning on a power field effect" It should read: -- 12. A biasing circuit for turning on a power field effect --;

Signed and Sealed this

Twenty-third Day of July, 2002

Attest:

Attesting Officer

JAMES E. ROGAN
*Director of the United States Patent and Trademark Office*